United States Patent [19]

Sugio et al.

[11] Patent Number: 4,861,854

[45] Date of Patent: * Aug. 29, 1989

[54] PHOTOSENSITIVE POLYIMIDE PRECURSOR

[75] Inventors: Akitoshi Sugio, Yokkaichi; Takao Kawaki, Tokyo; Makoto Kobayashi, Nagareyama; Katsushige Hayashi, Matsudo; Masahito Watanabe, Tokyo, all of Japan

[73] Assignee: Mitsubishi Gas Chemical Company, Inc., Tokyo, Japan

[*] Notice: The portion of the term of this patent subsequent to Jun. 2, 2004 has been disclaimed.

[21] Appl. No.: 200,864

[22] Filed: Jun. 1, 1988

Related U.S. Application Data

[63] Continuation of Ser. No. 3,877, Jan. 16, 1987, abandoned.

[30] Foreign Application Priority Data

Feb. 3, 1986 [JP] Japan ................................. 61-20189

[51] Int. Cl.$^4$ ....................... C08G 16/00; C08G 73/10

[52] U.S. Cl. ................................... 528/125; 528/128; 528/172; 528/173; 528/185; 528/188; 528/208; 528/220; 528/229; 528/353; 430/286; 564/342; 564/343; 564/345; 568/306

[58] Field of Search ............... 528/125, 128, 172, 173, 528/185, 188, 208, 220, 229, 353

[56] References Cited

U.S. PATENT DOCUMENTS 4,670,535 1/1987 Sugio et al. ...................... 528/229

FOREIGN PATENT DOCUMENTS 3620514 5/1987 Fed. Rep. of Germany .
131227 8/1982 Japan .
145216 8/1984 Japan .

OTHER PUBLICATIONS

Hochmolekularbericht 1983, III-08.
Chang et al., Taiwan Ko Hsu 1978, 32 (4).

Primary Examiner—John Kight
Assistant Examiner—Frederick Krass
Attorney, Agent, or Firm—Armstrong, Nikaido Marmelstein Kubovcik & Murray

[57] ABSTRACT

A photosensitive polyimide precursor composed of the structural units (A) represented by the following general formula (I) and the structural units (B) represented by the following general formula (II), in which the ratio of the molar quantity of the structural units (A) to the sum of the molar quantity of the structural units (A) and that of the structural units (B) is 0.01 or greater, and having a viscosity of 100 cP or above as measured at 25° C. in the state of a 10% by weight solution in N-methylpyrrolidone:

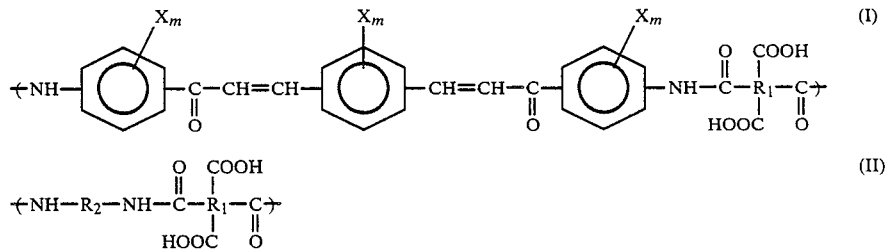

wherein $R_1$ represents a tetravalent aromatic hydrocarbon residue; $R_2$ represents a divalent aromatic hydrocarbon residue; X, identical or different represents a halogen or an alkyl group; and m represents 0 or an integer from 1 to 4. The photosensitivity of the present photosensitive polyimide precursor is about 20 to 100 times that of conventional products. After heat dehydration cyclization, it shows a heat resistance of 400° C. or above.

5 Claims, No Drawings

PHOTOSENSITIVE POLYIMIDE PRECURSOR

This is a continuation of application Ser. No. 003,877 filed Jan. 16, 1987, now abandoned.

BACKGROUND OF THE INVENTION

The present invention relates to a photosensitive polyimide precursor. More particularly, the invention relates to a photosensitive polyimide precursor capable of producing a polyimide resin having high heat resistance and high photosensitivity.

Having the properties required for electronic material such as heat resistance, insulating property, adhesiveness, etc., polyimide resins are used in the field of semiconductor industry as a substitute for inorganic materials, for example, as a structural material for hydrid high-density printed circuit boards.

Especially, attention is given to photosensitive polyimide resins because of their potencies for enabling remarkable simplification of the semiconductor production process and flattening of the pattern in addition to their possession of specific properties of polyimide. The photosensitive polyimide resins now available, however, are not always satisfactory in photosensitivity.

The present invention provides a photosensitive polyimide precursor used for interlayer insultating films, surface protective films, etc., which precursor has a sufficient photosensitivity for use as a starting material for the production of semiconductors and enables formation of a fine pattern, and which, by a heat treatment, can be made into a polyimide resin having excellent heat resistance.

The conventional polyimide type photosensitive polymers can be roughly classified into two types: the polyimides having photosensitive groups in the side chain and the polyimides having photosensitive groups in the main chain.

The former type of polymers, that is, those having photosensitive groups in the side chain, are disclosed, for instance, in Japanese Patent Kokai (Laid-Open) Nos. 116216/79, 116217/79, 145794/79, 9510/80, 9538/80, 45746/80, 45748/80 and 143329/82. These polymers are subject to a loss of photosensitive groups in the course of heat treatment for cyclization, resulting in a marked decrease in thickness of the formed film. Also, these polymers are not always satisfactory in photosensitivity. Thus, this type of polymers present problems in practical use thereof.

The latter type of polymers, or those having photosensitive groups in the main chain, are free from scattering loss of photosensitive groups in the heat treatment for cyclization. In Japanese Patent Kokai (Laid-Open) No. 131227/82, for instance, there is disclosed an imide resin having as its diamine component a diamine represented by the following general formula (III):

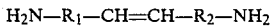

wherein $R_1$ and $R_2$ represent independently a divalent aromatic or aliphatic group. Also, Japanese Patent Kokai (Laid-Open) No. 145216/84 discloses a polyamideimide resin prepared by using a diamine represented by the following general formula (IV) as diamine component:

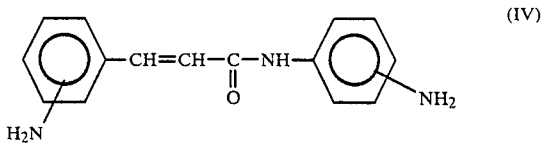

Both of these polymers are characteristically soluble in organic solvents. However, the polymer proposed in Japanese Patent Kokai No. 131227/82 is in the range of 310°–380° C. in thermal decomposition temperature and has a photosensitivity of only about 5 J/cm², while the polymer proposed in Japanese Patent Kokai No. 145216/84, although higher than 400° C. in thermal decomposition temperature, is less than 3.5 J/cm² in photosensitivity. Thus, both of them are unsatisfactory for practical use.

SUMMARY OF THE INVENTION

The present inventors have pursued studies on polyamide acids, or polyimide precursors, having photosensitive groups in the main chain with the object of affording thereto about 2 to 100 times as high photosensitivity as that of the conventional products and a heat resistance of 400° C. or above after dehydration cyclization, and as a result, they have succeeded in obtaining a high-sensitivity heat-resistant photosensitive resin meeting said requirements and also in formulating a process for producing such resin.

Thus, in accordance with this invention, there is provided a photosensitive polyimide precursor consisting essentially of of the structural units (A) represented by the following general formula (I) and the structural units (B) represented by the following general formula (II), in which the ratio of the molar quantity of said structural units (A) to the sum of the molar quantity of said structural units (A) and that of said structural units (B) is 0.01 or above, and having a viscosity of 100 centipoises or above as measured at 25° C. in the state of a 10% by weight solution in N-methylpyrrolidone:

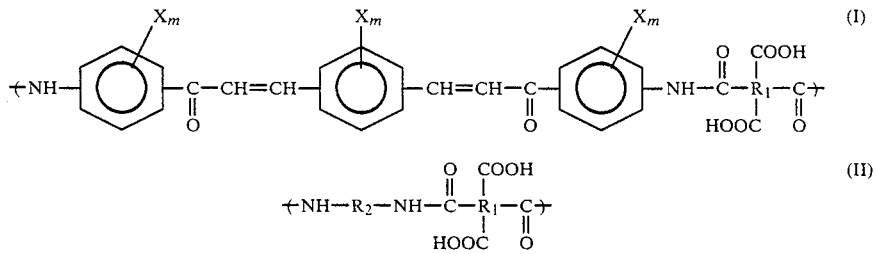

wherein $R_1$ represents a tetravalent aromatic hydrocarbon residue; $R_2$ represents a divalent aromatic hydrocarbon residue; X, which may be identical or different, represents a halogen or an alkyl group; and m represents 0 or an integer from 1 to 4.

DESCRIPTION OF THE PREFERRED EMBODIMENTS

In the present invention, the tetravalent aromatic hydrocarbon residue represented by $R_1$ in the general formulae (I) and (II) is a monocyclic aromatic hydrocarbon residue, a polycyclic aromatic hydrocarbon residue or a residue formed by direct linkage of said residues or linkage thereof through the intermediation of other bond. Such residues include those of the following structural formulae:

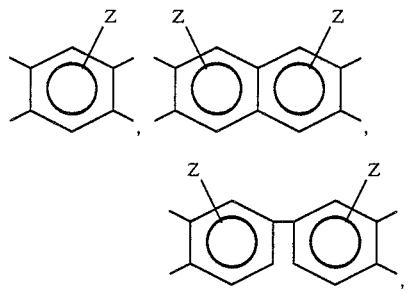

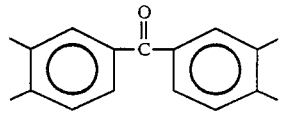

Such tetravalent aromatic hydrocarbon residues are usually derived from aromatic tetracarboxylic acid dianhydrides, preferably from pyromellitic acid dianhydride, 3,3′,4,4′-biphenyltetracarboxylic acid dianhydride and 3,3′,4,4′-benzophenonetetracarboxylic acid dianhydride.

Said structural unit (A) is derived from these aromatic tetracarboxylic acid dianhydrides and bis-(aminobenzoylethenyl)benzene. Preferred examples of such bis(aminobenzoylethenyl)benzene are 1,4-bis(2-(3-aminobenzoyl)ethenyl)benzene and 1,4-bis(2-(4-aminobenzoyl)ethenyl)benzene.

As for the divalent aromatic hydrocarbon residues represented by $R_2$ in the general formula (II), those of the following structural formulae are preferred. These residues exist singly or as a mixture in the structural unit (B) represented by the general formula (II).

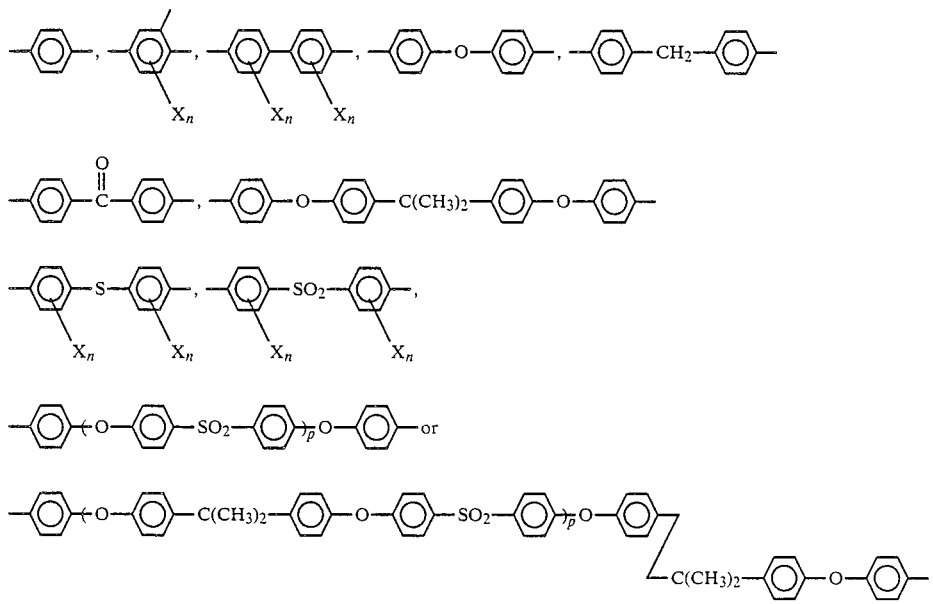

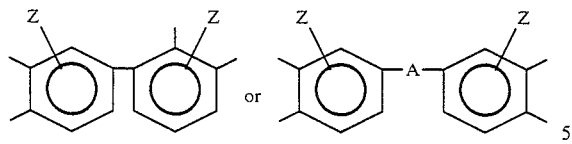

wherein A represents —CH$_2$—, —O—, —S—, —CO—, —SO$_2$—, —C(CH$_3$)$_2$— or —C(CF$_3$)$_2$—; and Z, which may be identical or different, represents hydrogen atom, a halogen group or an alkyl group.

Among them, those of the following structural formulae are especially preferred.

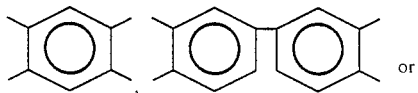

wherein X, identical or different, represents a halogen or a methyl group; n represents 0 or an integer from 1 to 4; and p represents an integer from 1 to 15.

Among them, those of the following structural formulae are more preferred.

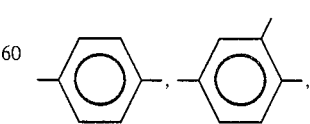

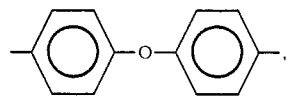

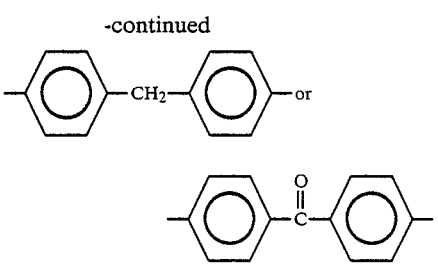

The structural unit (B) is derived from said aromatic tetracarboxylic acid dianhydrides and the aromatic diamines having the above-shown $R_2$ structures. Preferred examples of such aromatic diamines are paraphenylenediamine, metaphenylenediamine, 4,4'-diaminodiphenylether, 4,4'-diaminodiphenylmethane and 4,4'-diaminodiphenylketone.

In the photosensitive polyimide precursor of this invention, both of the structural units (A) and (B) may exist in a random fashion or blockwise.

It is essential, however, that said precursor is a high-molecular weight substance having a viscosity of 100 cP or above as measured at 25° C. in the state of a 10% by weight solution in N-methylpyrrolidone. If the viscosity is below 100 cP, the photosensitive properties of the product will be poor.

The ratio in content between the structural units (A) and (B) in the precursor of this invention should be such that the ratio of the molar quantity of structural units (A) to the sum of the molar quantity of structural units (A) and that of structural units (B) is 0.01 or above, preferably 0.05–0.95. If this ratio is less than 0.01, no satisfactory photosensitive properties will be obtained.

The terminal structure of the polyimide precursor of this invention varies depending on whether a molecular weight regulator is used or not, as well as on the molar ratio between monomers. When no molecular weight regulator is used, the terminal structure becomes —NH$_2$ when the diamino compound is used in an excessive amount, while the terminal structure becomes

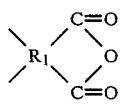

when the tetracarboxylic acid anhydride is excessive. When a molecular weight regulator is used, the terminal structure becomes a reaction product of the above-mentioned end structures and the molecular weight regulator.

As the molecular weight regulator, monofunctional compounds readily reactive with the diamino compound or the tetracarboxylic acid dianhydride, such as water, alcohol, phenol, amine, dicarboxylic acid anhydride, monoisocyanate and the like, can be used.

The photosensitive polyimide precursor of this invention can be produced by polycondensing said tetracarboxylic acid dianhydride, bis(aminobenzoylethenyl)-benzene and aromatic diamine in an organic polar solvent solution under stirring.

The organic polar solvents usable for this polycondensation reaction include N,N-dimethylformamide, N,N-diethylformamide, N,N-dimethylacetamide, N,N-diethylacetamide, N,N-dimethylmethoxiacetamide, N-methylcaprolactam, dimethyl sulfoxide, N-methyl-2-pyrrolidone, dimethylsulfone, hexamethylphosphoamide, tetramethylenesulfone, N-acetyl-2-pyrrolidone and the like. These solvents can be used either singly or in combination.

Regarding the polycondensation reaction conditions, the polymer concentration should not exceed 50% by weight, the preferred polymer concentration being 5 to 25% by weight, and the reaction temperature is preferably not higher than 100° C., usually 50° C. or below.

The reaction time is properly decided according to the molecular weight of the polymer to be produced, polymer concentration and reaction temperature, but it is usually 0.2 to 24 hours.

The thus obtained photosensitive polyimide precursor has a photosensitivity of 1 to 500 mJ/cm$^2$, which is approximately 2 to 100 times that of the conventional polyimide precursors having photosensitive groups in the main chain.

This photosensitive polyimide precursor is cross-linked at the site of double bond upon irradiation with light, and it can be subjected as it is to pattern working by using the ordinary photoresist technology. In this process, a known type of photosensitive initiator and photosensitizer may be added for further improving the photosensitivity.

The crosslinked polyimide precursor is then subjected to a heat treatment at 120°–450° C. for cyclization and imidation. For instance, when it is heat treated at 350° C. for imidation, the resulting product is provided with such excellent heat resistance that it suffers from no weight loss by thermal decomposition even at 400° C.

The polyimide precursor of this invention can best be used for interlayer insulating film and surface protective film, but it is also usable for other types of film such as gas separating film and liquid separating film.

The present invention will hereinafter be described in further detail according to the examples thereof, which examples are however merely intended to be illustrative and not limitive of the scope of the invention.

REFERENTIAL EXAMPLE 1

A diamino compound to be used as starting material was synthesized.

36.1 g (0.267 mol) of m-aminoacetophenone and 16.1 g (0.12 mol) of terephthalaldehyde were added into 240 ml of acetic acid and dissolved by heating. Then 20 g of concentrated sulfuric acid was added dropwise thereto and the mixture was stirred and reacted at 80° C. for 2 hours.

After the reaction, the precipitated product was filtered out, again dissolved in about 300 ml of N,N-dimethylacetamide and neutralized with an aqueous solution of sodium hydrogencarbonate.

The precipitate formed upon neutralization was dissolved in 1,4-dioxane and filtered to remove the salt, after which the filtrate was poured into about 1 liter of water. The resulting yellow precipitate was washed with methanol and dried in vacuo.

The thus obtained 29.6 g of product was identified to be 1,4-bis[2-(3-aminobenzoyl)ethenyl]benzene (hereinafter referred to as mp-BAEB) by IR, NMR and GC-MS analyses.

EXAMPLE 1

2.50 g (6.8 mmol) of mp-BAEB obtained in Referential Example 1 and 1.36 g (6.8 mmol) of 4,4'-diaminodiphenylether were dissolved in 61 g of N,N-dimethylacetamide in a nitrogen atmosphere.

Into this solution was gradually added 2.96 g (13.6 mmol) of pyromellitic anhydride which had been purified by sublimation, and the mixture was reacted at 20° C. for 3 hours.

The reaction solution was poured into 1 liter of acetone to precipitate the produced polymer.

This precipitate was filtered and dried to obtain 6.5 g of a photosensitive polyimide precursor having a structure consisting of the following two randomly bonded structural units (molar ratio=1:1):

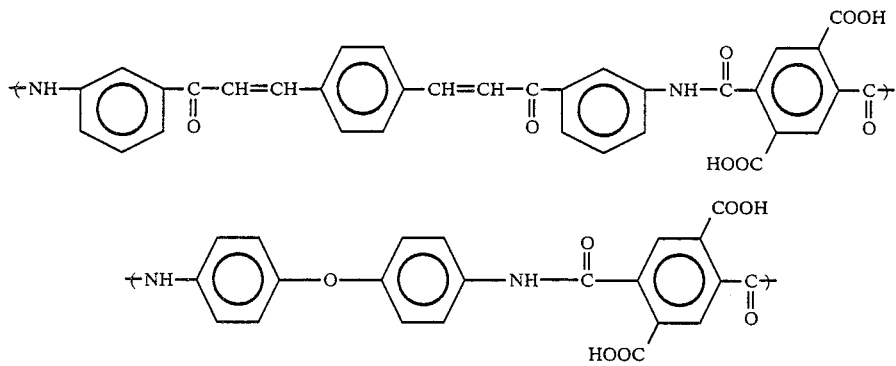

3.0 g of this photosensitive polyamide acid was dissolved in 27 g of N-methylpyrrolidone to prepare a varnish having a concentration of 10% of weight. The viscosity of this varnish at 25° C. was 4,000 cP. This varnish was spin-coated on a brush-polished aluminum plate to form a coating film.

After drying the film, a pattern mask film was tightly attached to said film and irradiated with 10 mJ/cm² of light from a 500 W super-high pressure mercury lamp, followed by development with a 4:1 mixture of N,N-dimethylacetamide and acetone. The treatment gave a negative type concave-convex pattern having the exposed area cured.

In another similar experiment, in place of said pattern mask film, Eastman Kodak Step Tablet 2A was attached tightly to the coating film and irradiated with light from a super-high pressure mercury lamp (10 mW/cm²) for a period of 60 seconds, followed by the same developing process as described above. There was obtained a clear image up to the 16th step of the Step Tablet.

Then, a thick film of said varnish was heated in an electric furnace at 400° C. for one hour, and there resultantly occurred cyclization and imidation of said polyimide precursor to give a corresponding polyimide.

Measurement of heat resistance of this polyimide by a thermogravimetric analysis showed that it suffered from no weight loss at temperatures up to 420° C.

EXAMPLE 2

Example 1 was repeated but by using 4.37 g (13.6 mmol) of 3,3',4,4'-benzophenonetetracarboxylic acid dianhydride in place of pyromellitic dianhydride and 74 g of N-methylpyrrolidone in place of N,N-dimethylacetamide to obtain 7.8 g of a photosensitive polyimide precursor having a structure consisting of the following two structural units bonded randomly (molar ratio=1:1).

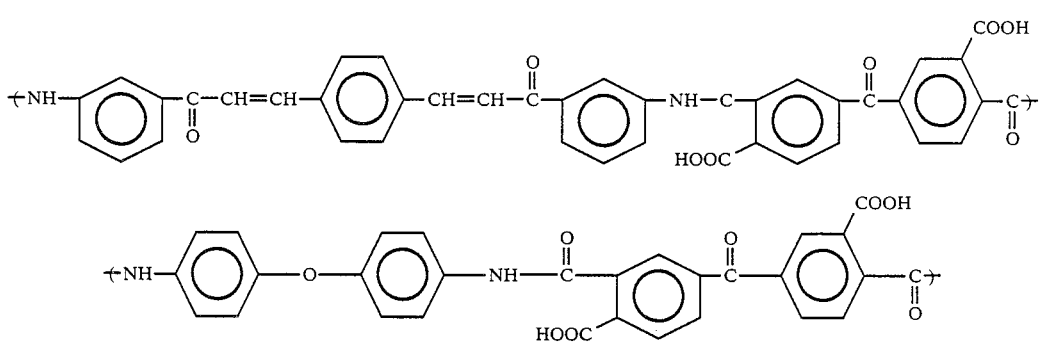

By using this photosensitive polyimide precursor, the same photosensitivity test as in Example 1 was conducted (varnish viscosity: 1,500 cP). There was obtained a negative type concave-convex pattern having its exposed portion cured at an exposure of 50 mJ/cm². In the test using Step Tablet 2A, clear images were obtained up to the 13th step of Step Tablet by 60-second irradiation with light from a super-high pressure mercury lamp (10 mW/cm²).

Then, this varnish film was heated in an electric furnace at 400° C. for one hour. Consequently, there took place cyclization and imidation of said polyimide precursor to form a corresponding polyimide.

Heat resistance of this polyimide was determined by a thermogravimetric analysis. No weight loss was seen up to the temperature of 420° C.

EXAMPLE 3

Example 1 was repeated but by replacing mp-BAEB with 1,4-bis[2-(4-aminobenzoyl)ethenyl]benzene (hereinafter referred to as pp-BAEB) synthesized from para-aminoacetophenone and terephthalaldehyde in the similar way to Referential Example 1.

There was obtained 7.8 g of photosensitive polyimide precursor of which the test results showed varnish viscosity fo 2,000 cP, Step Tablet sensitivity of up to 14th step, and polyimide weight loss-causing temperature of 425° C.

EXAMPLES 4–15

Example 1 was repeated by using mp-BAEB or pp-BAEB and various kinds of aromatic diamines and acid dianhydrides to obtain the corresponding polyimide precursors and polyimides.

The yield and Step Tablet (ST) sensitivity of these polyimide precursors and the weight loss-causing temperature of the polyimides were as shown in Table 1.

In table 1, the following abbreviations were used for the aromatic diamines and acid dianhydrides:

Aromatic diamines

DADE: 4,4'-diaminodiphenylether
PPDA: paraphenylenediamine
MPDA: metaphenylenediamine
DADM: 4,4'-diaminodiphenylmethane
DADK: 4,4'-diaminodiphenylketone
BAPP: 2,2-bis[4-(4-aminophenoxy)ethenyl]propane

Acid dianhydrides

PMDA: pyromellitic dianhydride
BPTA: 3,3',4,4'-biphenyltetracarboxylic acid dianhydride
BTA: 3,3',4,4'-benzophenonetetracarboxylic acid dianhydride

TABLE 1

| Example No. | BAEB Kind | BAEB Amount g (mmol) | Aromatic diamine Kind | Aromatic diamine Amount g (mmol) | Acid dianhydride Kind | Acid dianhydride Amount g (mmol) | ST sensitivity, step | Polyimide weight loss-causing temp. (°C.) |
|---|---|---|---|---|---|---|---|---|
| 4 | mp-BAEB | 3.50 (9.52) | DADE | 0.82 (4.08) | PMDA | 2.96 (13.6) | 16 | 410 |
| 5 | " | 1.50 (4.08) | " | 1.90 (9.52) | " | 2.96 (13.6) | 10 | 430 |
| 6 | " | 0.50 (1.36) | " | 2.45 (12.24) | " | 2.96 (13.6) | 6 | 450 |
| 7 | " | 2.50 (6.80) | " | 1.36 (6.80) | BTA | 4.00 (13.6) | 14 | 420 |
| 8 | " | 2.50 (6.80) | PPDA | 0.73 (6.80) | PMDA | 2.96 (13.6) | 17 | 410 |
| 9 | " | 2.50 (6.80) | MPDA | 0.73 (6.80) | " | 2.96 (13.6) | 17 | 410 |
| 10 | " | 2.50 (6.80) | DADM | 1.35 (6.80) | " | 2.96 (13.6) | 16 | 400 |
| 11 | " | 2.50 (6.80) | DADK | 1.44 (6.80) | " | 2.96 (13.6) | 15 | 410 |
| 12 | " | 2.50 (6.80) | BAPP | 2.79 (6.80) | " | 2.96 (13.6) | 13 | 420 |
| 13 | " | 2.50 (6.80) | DADK | 1.44 (6.80) | BPTA | 4.37 (13.6) | 12 | 410 |
| 14 | pp-BAEB | 3.50 (9.52) | DADE | 0.82 (4.80) | PMDA | 2.96 (13.6) | 15 | 410 |
| 15 | " | 1.50 (4.08) | " | 1.90 (9.52) | " | 2.96 (13.6) | 9 | 430 |

What is claimed is:

1. A photosensitive polyimide precursor consisting essentially of the structural units (A) represented by the following general formula (I) and the structural units (B) represented by the following general formula (II), wherein the ratio of the molar quantity of said structural units (A) to the sum of the molar quantity of said structural units (A) and that of said structural units (B) is 0.01 or greater, and having a viscosity of 100 cP or above as measured at 25° C. in the state of a 10% by weight solution in N-methylpyrrolidone:

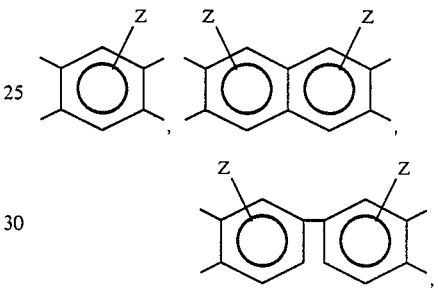

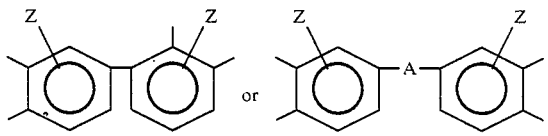

wherein $R_1$ represents a tetravalent aromatic hydrocarbon residue; $R_2$ represents a divalent aromatic hydrocarbon residue; X, identical or different, represents a halogen or an alkyl group; and m represents 0 or an integer from 1 to 4.

2. A photosensitive polyimide precursor according to claim 1, wherein $R_1$ is one of the tetravalent aromatic hydrocarbon residues of the following structures:

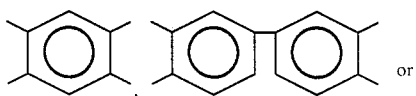

wherein A represents —$CH_2$—, —O—, —S—, —CO—, —$SO_2$—, —$C(CH_3)_2$- or —$C(CF_3)_2$-; and Z, identical or different, represents hydrogen atom, a halogen group or an alkyl group.

3. A photosensitive polyimide precursor according to claim 2, wherein $R_1$ is one of the tetravalent aromatic hydrocarbon residues of the following structures:

-continued

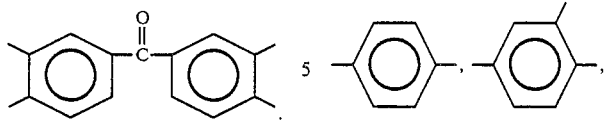

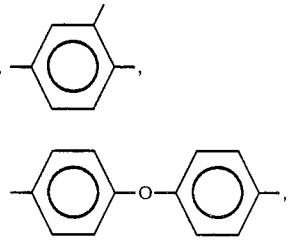

4. A photosensitive polyimide precursor according to claim 1, wherein $R_2$ is one of the divalent aromatic hydrocarbon residues of the following structures:

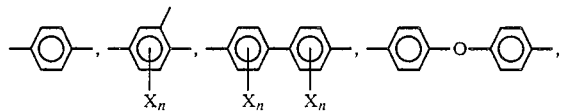

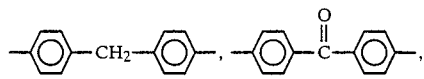

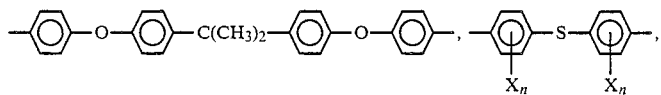

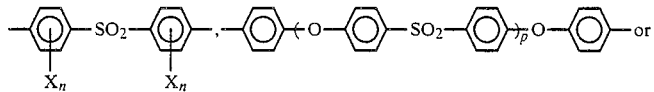

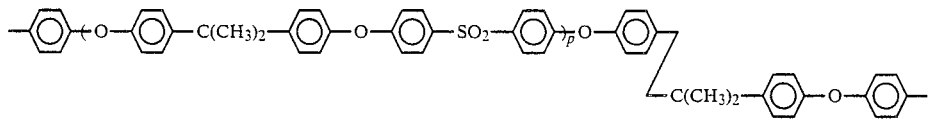

wherein X, identical or different, represents a halogen or a methyl group; n represents 0 or an integer from 1 to 4; and p represents an integer from 1 to 15.

5. A photosensitive polyimide precursor according to claim 4, wherein $R_2$ is one of the divalent aromatic hydrocarbon residues of the following structures:

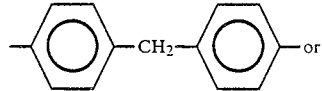

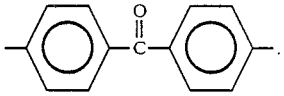

* * * * *